(12) United States Patent
Colabella et al.

(10) Patent No.: US 6,376,306 B1
(45) Date of Patent: Apr. 23, 2002

(54) METHOD FOR FORMING NON VOLATILE MEMORY STRUCTURES ON A SEMICONDUCTOR SUBSTRATE

(75) Inventors: Elio Colabella, Milan; Emilio Camerlenghi, Bergamo, both of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/459,754

(22) Filed: Dec. 10, 1999

(30) Foreign Application Priority Data

Dec. 29, 1998 (IT) .................................... MI98A 002843

(51) Int. Cl.[7] ........................................... H01L 21/336
(52) U.S. Cl. ...................................... 438/257; 438/266
(58) Field of Search ............................... 438/257, 258, 438/266, 267, 301, 305, 306, 510, 514, 637, 663

(56) References Cited

U.S. PATENT DOCUMENTS 5,303,185 A * 4/1994 Hazani ........................ 365/185
5,768,186 A * 6/1998 Ma ........................ 365/185.01
6,211,548 B1 * 4/2001 Ma ............................ 257/321

* cited by examiner

Primary Examiner—David Nelms
Assistant Examiner—David Nhu
(74) Attorney, Agent, or Firm—Lisa K. Jorgenson; Robert Iannucci; Seed IP Law Group, PLLC

(57) ABSTRACT

An improved method of making semiconductor memory structures that include a memory matrix having non-volatile memory cells, each with a floating gate transistor and a selection transistor, each transistor provided with a gate electrode. Associated with the memory matrix is control circuitry, which also have control gates. The method includes forming the gate electrodes on top of the semiconductor substrate and then depositing a dielectric layer over the whole memory structure. A screening layer is deposited over the whole surface of the memory structure, and then part of it is removed, exposing a portion of the control circuitry. A portion of the dielectric layer is etched away in the non-covered portion of the control circuitry to form spacer regions, and the non-covered portion of the control circuitry is then implanted with a dopant.

11 Claims, 2 Drawing Sheets

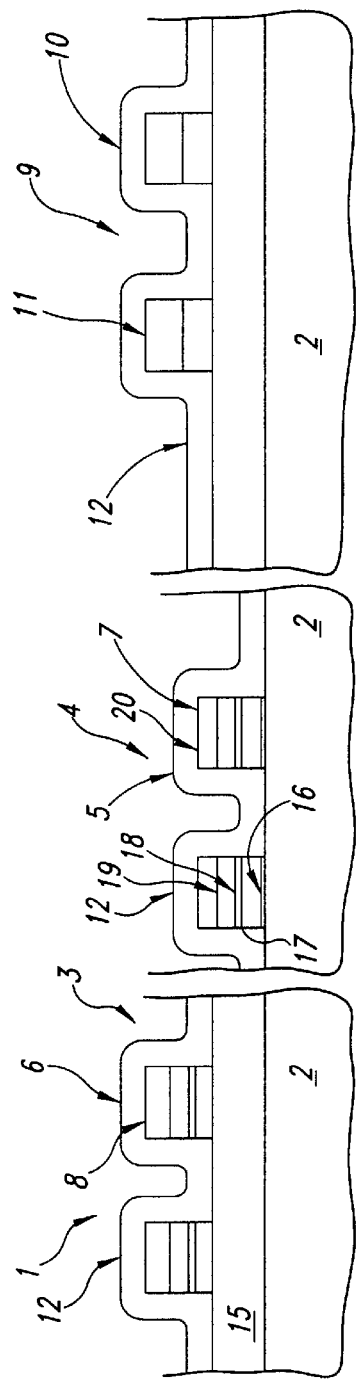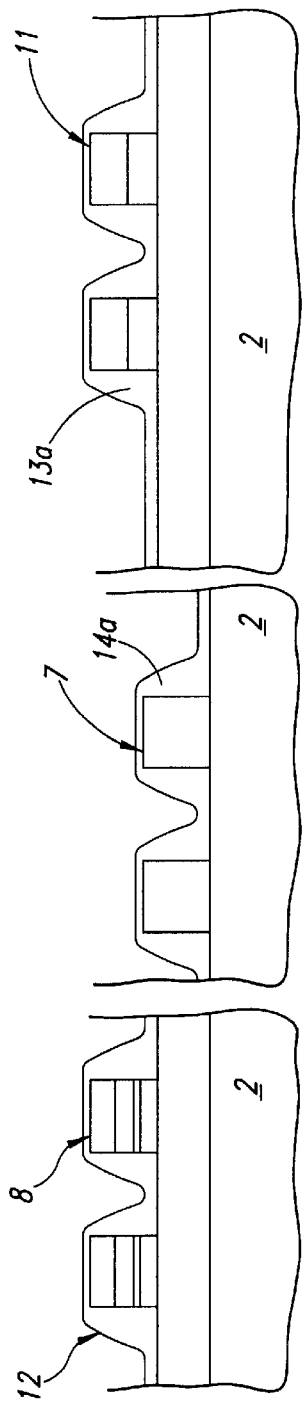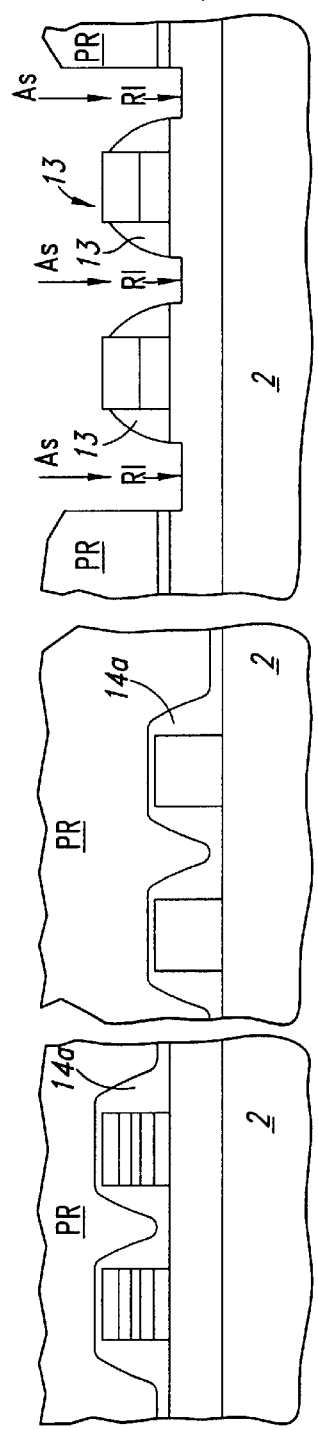

METHOD FOR FORMING NON VOLATILE MEMORY STRUCTURES ON A SEMICONDUCTOR SUBSTRATE

BACKGROUND OF THE INVENTION

1. Field of the Invention

This invention relates to an improved method of making non-volatile memory structures in a semiconductor substrate, and, more specifically to an improved method of making memory structures that comprises different steps than those previously used.

2. Description of Related Art

Embodiments of the invention relate, in particular but not exclusively, to a method of fabricating non-volatile memory structures, and reference will be made to this field of application in the ensuing description for convenience of explanation.

As is well known, non-volatile memory structures comprise a memory matrix constructed from non-volatile memory cells, each comprising a floating gate MOS transistor and associated selection transistor, and control circuitry which comprises active elements, such as MOS transistors.

According to the prior art some of the transistors provided in the memory structure may have source and drain regions formed by an LDD (Lightly Doped Drain) deposition technique. A process flow for making such memory structures is illustrated by FIGS. 1 and 2, wherein the memory structures are denoted by the reference numeral 100.

The memory structure 100 comprises a memory matrix 30, and circuitry 90 associated with the matrix 30. The structure 100 is integrated in a semiconductor substrate 20, and the process flow for its fabrication includes forming initially a layer 150 of field oxide on the substrate 20 surface. This field oxide layer 150 is then removed selectively to produce the active areas wherein the non-volatile memory cells 40 of the matrix 30 are later formed.

A stacked structure, comprising a first polysilicon layer 170, an intermediate dielectric layer 180, a second polysilicon layer 190, and a transition metal layer 200, is subsequently deposited onto the substrate portion which is to accommodate the matrix 30. Using a conventional photolithographic technique, the stacked structure is defined with gate electrodes 70 of the cells 40, in the active areas of the matrix 30.

Simultaneously therewith, gate electrodes 80 of the selection transistors of the memory cells 40 are optionally defined in the field oxide layer 150 of the matrix 30.

The circuitry 90 of the matrix 30 is instead deposited a stacked structure, comprising the second polysilicon layer 190 and the transition metal layer 200, in which structure gate electrodes 110 for transistors 101 in the circuitry 90 are defined.

The process flow is continued conventionally until the entire surface of the substrate 20 is deposited a dielectric layer 120, later to be used for defining isolation spacers.

In the prior art, isolation side spacers 140, adjoining each gate electrode 70, 80 of the cell 30 and the selection transistors, are defined at the same time as isolation side spacers 130 are defined which adjoin each gate electrode 110 of the transistors in the circuitry 90. However, in etching away the dielectric layer 120 in order to form the isolation spacers 130, 140, the etching will also affect the field oxide layer 150 of the matrix 30. Thus, openings 141 and 131 are created in this oxide layer 150.

The presence of such openings 141 and 131 may result in increased junction leakage current. This effect is intensified by using the differential field process flow whereby the thickness is smaller at the matrix than at the circuitry.

The process flow is continued conventionally with the use of a resist mask, known as mask 605 in the process flow employed by the Applicant, following a semiconductor annealing step. This mask is used for defining heavily doped regions with a first type of conductivity of the transistors 101 in the circuitry 90.

By a first implantation using arsenic ions, the heavily doped regions with a first type of conductivity of the transistors 101 in the circuitry 90 can be defined.

After removing the mask 605, a second mask—known as mask 655 in the process flow employed by the Applicant—is used to define heavily doped regions with a second type of conductivity of the remaining transistors 101 in the circuitry 90.

By a second implantation using, preferably, boron ions, the heavily doped regions with a second type of conductivity of the remaining transistors 101 in the circuitry 90 can be defined.

SUMMARY OF THE INVENTION

Embodiments of this invention provide an improved method of making memory structures, whereby the shortcomings connected with defining the isolation spacers that beset prior art memory structures can be removed.

Embodiments of the present invention have the memory matrix screened off during the step of etching away the oxide layer to define isolation spacers for the circuitry transistors by means of a mask already provided in standard processes.

Based on this principle, an embodiment of this invention provides for forming a screening layer over the whole surface of the memory structure; masking, using photolithographic methods, to define regions to be implanted for circuitry transistors; etching away the dielectric layer to define side isolation spacers adjoining each gate electrode of the circuitry transistors; and imparting, as by implantation, a predetermined conductivity to the implanted regions of the circuitry.

In some embodiments, a step of partially etching back the dielectric layer is carried out before forming the screening layer.

The features and advantages of a device according to the invention can be more clearly understood by reading the following description of an embodiment thereof, given by way of non-limitative example with reference to the accompanying drawings.

BRIEF DESCRIPTION OF THE DRAWINGS

FIGS. 3 to 5 are respective cross sectional views of some portions of the semiconductor substrate, not necessarily adjacent to one another, in the run of a fabrication process according to embodiments of the invention.

DETAILED DESCRIPTION OF THE INVENTION

Figure 1:
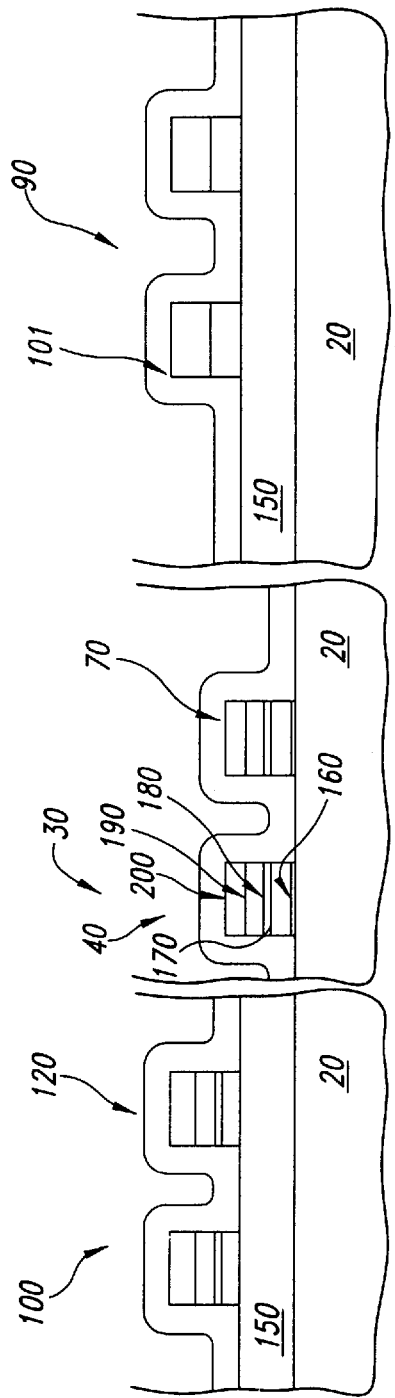
FIGS. 1 and 2 are respective cross sectional views of some portions of the semiconductor substrate, not necessarily adjacent to one another, in the run of a fabrication process according to the prior art.
Figure 2:
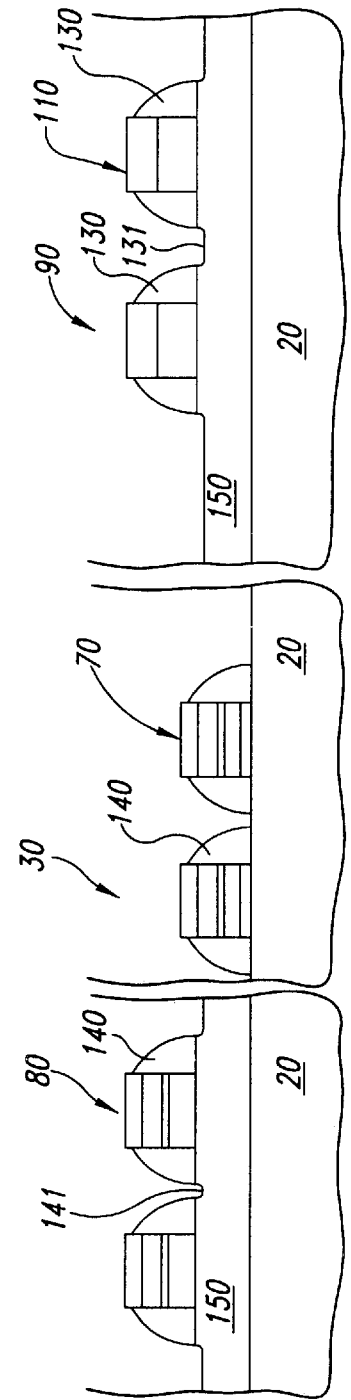

Illustrated by FIGS. 3 to 5 is an improved method of fabricating a non-volatile memory structure 1 integrated in a semiconductor substrate 2, according to embodiments of the invention. Some process steps will not be described in detail hereinafter, to avoid burdening this -description with information which is of minor consequence because they are well known to the skilled persons in the art.

The process flow for making a memory structure 1 comprised of a memory matrix 3 and circuitry 9 associated with the matrix 3, includes forming a layer 15 of field oxide over the surface of the substrate 2. This field oxide layer 15 is selectively removed to provide active areas wherein non-volatile memory cells 4 of the matrix 3 are later formed.

A layer 16 of gate oxide is deposited in the active areas. This is followed by the deposition, on the substrate portion where the matrix 3 is later formed, of a stacked structure comprising a first polysilicon layer 17, an intermediate dielectric layer 18, a second polysilicon layer 19, and a layer comprising a transition metal 20.

Using a conventional photolithographic technique, gate electrodes 7 are defined in the stacked structure for the floating-gate MOS transistors 5 of the cells 4, within the active areas of the matrix 3. Simultaneously therewith, the gate electrodes 8 for the selection transistors 10 of the memory cells 4 are defined in the field oxide layer 15 of the matrix 3.

The circuitry 9 of the matrix 3 has deposited a stacked structure comprising, for example, the second polysilicon layer 19 and the transition metal layer 20, wherein gate electrodes 11 are defined for the transistors 10 of the circuitry 9.

The process is then continued conventionally up to the deposition, onto the whole surface of the substrate 2, of a dielectric layer 12 later to be utilized for defining isolation spacers. In a preferred embodiment, the thickness of this dielectric layer 12 may vary between 500 Å and 2000 Å. Also in a preferred embodiment, the dielectric layer 12 is TEOS, but may also be a nitride containing layer.

According to this embodiment, a step of partially etching back the dielectric layer 12 is carried out to define side isolation regions 13a and 14a adjoining each of the gate electrodes 7, 8, 11 formed at the matrix 3 and the circuitry 9.

A semiconductor annealing step is then carried out which is followed by the formation of a screening layer PR over the semiconductor. A screening layer-defining mask, known as mask 605 in the process flow employed by the Applicant, is employed to protect parts of the matrix 3, and part of the circuitry 9 for reasons below-described.

Subsequently, an oxide etch is performed in the portion of the circuitry area 9 not covered by the 605 mask. This allows the non-covered isolation regions 13a to be formed into isolation spacers 13, as seen in FIG. 5. An implanting step follows, using arsenic ions, for example. This implantation allows heavily doped regions with a first type of conductivity to be defined at the circuitry 9.

With the mask 605 removed, a new screening layer PR is formed over the semiconductor, and a mask for defining this screening layer—known as mask 655 in the process flow employed by the Applicant—is employed to protect parts of the matrix 3, and other parts of the circuitry 9.

Then, a further etching step is carried out on the remaining isolation regions 13a that are not covered by the 655 mask to form the remainder of the isolation spacers 13. An implanting step using boron ions, for example, follows, which forms heavily doped regions of a second type of conductivity to be defined at the circuitry 9.

The residue of the partially etched-back dielectric layer, including the isolation regions 14a in cell portions other than the circuitry area 9, does not create a problem for later processing. Later processing steps, for instance the steps in forming the contacts for the memory matrix 3, have a sufficiently long etch to remove this additional layer of oxide.

In another embodiment, where the thickness of the dielectric 12 is on the order of 500 Å, the etching step for defining the isolation regions 13a and 14a may be omitted from the process flow and thus leave the dielectric layer 12 intact. In the embodiment where there is no partial etchback of the dielectric layer 12, the isolation spacers 13 at the circuitry 9 are defined directly from the thin dielectric layer 12, rather than having the intermediate steps of forming isolation regions 13a. The isolation spacers are formed after masking off the substrate portion where the matrix 3 locates, by means of the mask 605 and/or 665.

To summarize, the embodiments above described allow the isolation spacers 13 to be formed by steps of etching away the dielectric layer 12 that are of shorter duration than conventional ones, while simultaneously preventing overetching of the field oxide layer 15 at the matrix 3. It performs this function, yet no additional masks are utilized in the process, the only additional steps being two short oxide etches after the masks 605 and 655 are already in place.

Changes can be made to the invention in light of the above detailed description. In general, in the following claims, the terms used should not be construed to limit the invention to the specific embodiments disclosed in the specification and the claims, but should be construed to include all methods and devices that are in accordance with the claims. Accordingly, the invention is not limited by the disclosure, but instead its scope is to be determined by the following claims.

What is claimed is:

1. An improved method of making a memory structure on a semiconductor substrate, the memory structure including a memory matrix having non-volatile memory cells each comprised of a floating gate transistor and a selection transistor, each transistor having a respective gate electrode, and the memory structure also including circuitry associated with the memory matrix and comprising circuitry transistors having respective gate electrodes, the method comprising:

forming the gate electrodes of the floating gate, selection, and circuitry transistors on the semiconductor substrate;

depositing a dielectric layer over the gate electrodes of the floating gate, selection, and circuitry transistors of the memory structure;

forming an energy-reactive screening layer over the memory structure;

exposing a portion of the energy-reactive screening layer to an exposing energy to define implantation regions between the gate electrodes of the circuitry transistors;

etching first portions of the dielectric layer at the implantation regions to define side isolation spacers adjoining gate electrodes of the transistors in the circuitry while leaving the floating gate and selection transistors completely covered by a second portion of the dielectric layer; and implanting a dopant into the semiconductor substrate at the implantation regions.

2. The method according to claim 1, further comprising partially etching back the dielectric layer prior to forming the screening layer.

3. The method according to claim 2, wherein partially etching back the dielectric layer is performed over the entire surface of the memory structure.

4. The method according to claim 1, wherein the dielectric layer is TEOS.

5. The method according to claim 4, wherein the TEOS dielectric layer has a thickness of approximately 500 Å.

6. A method to form a memory device including non-volatile memory cells having selection transistors and floating gate transistors, the memory device also having related circuitry transistors, the method comprising:

covering a silicon substrate with a first oxide layer;

etching the first oxide layer in areas of the substrate where the floating gate transistors will be formed;

depositing a gate oxide layer on the areas of the substrate where the floating gate transistors will be formed, the gate oxide layer being less thick than the first oxide layer;

forming gate electrodes of the floating gate transistors on the gate oxide layer;

forming gate electrodes of the selection transistors and the circuitry transistors over areas of the substrate covered by the first oxide layer;

depositing a dielectric layer over the floating gate, selection, and circuitry transistors;

covering the selection and floating gate transistors, as well as covering a first portion of the circuitry transistors while leaving a second portion of the circuitry transistors uncovered;

etching the dielectric layer into spacers adjacent to the gate electrodes of the second portion of the circuitry transistors while leaving the gate electrodes of the floating gate and selection transistors covered by the dielectric layer; and implanting a first type dopant into the substrate adjacent to the spacers.

7. The method of claim 6, further comprising partially etching back the dielectric layer prior to covering the selection and floating gate transistors.

8. The method of claim 7, wherein partially etching back the dielectric layer is performed over the entire surface of the memory device.

9. The method of claim 6 further comprising:

covering the floating gate and selection transistors, as well as covering at least some of the second portion of the circuitry transistors while leaving at least some of the first portion of the circuitry transistors uncovered;

etching the dielectric layer into spacers adjacent to the gate electrodes of the at least some of the first portion of the circuitry transistors; and implanting a second type dopant into the substrate adjacent to the spacers of the at least some of the first portion of the circuitry transistors.

10. The method of claim 6, wherein the dielectric layer is TEOS.

11. The method of claim 10, wherein the TEOS dielectric layer has a thickness of approximately 500 Å.

* * * * *